(12) United States Patent
Nguyen et al.

(10) Patent No.: US 10,277,216 B1
(45) Date of Patent: Apr. 30, 2019

(54) WIDE RANGE INPUT VOLTAGE DIFFERENTIAL RECEIVER

(71) Applicant: Apple Inc., Cupertino, CA (US)

(72) Inventors: Huy M. Nguyen, San Jose, CA (US); Seong Hoon Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 20 days.

(21) Appl. No.: 15/717,865

(22) Filed: Sep. 27, 2017

(51) Int. Cl.
*H03F 3/45* (2006.01)
*H03K 7/08* (2006.01)
*G06F 17/50* (2006.01)

(52) U.S. Cl.
CPC ........... *H03K 7/08* (2013.01); *G06F 17/5045* (2013.01); *H03F 3/4521* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,264,573 A * | 8/1966 | Lefferts | ................. | H03K 3/2893 327/576 |
| 3,543,184 A * | 11/1970 | Lane | ....................... | H03K 3/282 331/111 |
| 4,814,642 A * | 3/1989 | Kleks | .................... | H03K 3/2885 327/208 |
| 5,012,246 A * | 4/1991 | Chung | ................. | H03M 1/0872 341/160 |
| 5,075,578 A * | 12/1991 | Wendell | ........... | H03K 3/356017 326/17 |
| 5,301,158 A * | 4/1994 | Yokomizo | .............. | G11C 7/062 327/210 |
| 5,835,999 A * | 11/1998 | Grosspietsch | .......... | G05F 3/242 327/328 |
| 6,018,253 A * | 1/2000 | Wendell | ................. | G11C 7/065 326/115 |
| 6,021,162 A * | 2/2000 | Gaboury | ............. | H04L 27/1563 375/242 |
| 6,542,015 B2 * | 4/2003 | Zhou | ...................... | H03K 5/007 327/172 |
| 6,831,501 B1 * | 12/2004 | Aude | ....................... | G05F 3/242 323/316 |
| 6,833,760 B1 * | 12/2004 | Aude | ....................... | H03F 1/086 330/261 |
| 9,654,092 B1 * | 5/2017 | Schaffer | ................ | H03K 5/2481 |
| 9,698,735 B1 * | 7/2017 | McCue | ................... | H03F 1/301 |
| 2003/0063496 A1 * | 4/2003 | Baglin | ................... | G11C 7/065 365/200 |

(Continued)

*Primary Examiner* — Adam D Houston
(74) *Attorney, Agent, or Firm* — Meyertons, Hood, Kivlin, Kowert & Goetzel, P.C.

(57) ABSTRACT

A method and apparatus for receiving reduced voltage swing signals is disclosed. A first amplifier may generate a first intermediate signal based on a difference between voltage levels of a first and second input signals, and a second amplifier may generate a second intermediate signal based on a difference in the voltage levels between the second and first input signals. A regenerative amplifier may increase a difference in the voltage level of the first and second intermediate signals using regenerative feedback and the voltage levels of the first and second input signals. A latch circuit may generate first and second output signals using the first and second intermediate signals.

20 Claims, 8 Drawing Sheets

(56) References Cited

U.S. PATENT DOCUMENTS

| | | | | |
|---|---|---|---|---|
| 2010/0202167 A1* | 8/2010 | Yang | ................... | H02M 3/3376 |
| | | | | 363/26 |
| 2010/0232183 A1* | 9/2010 | Yang | ................... | H02M 3/3376 |
| | | | | 363/21.02 |
| 2011/0316632 A1* | 12/2011 | Takemoto | ............... | H03F 1/223 |
| | | | | 330/277 |
| 2014/0103894 A1* | 4/2014 | McJimsey | ................. | G05F 1/67 |
| | | | | 323/282 |
| 2016/0254806 A1* | 9/2016 | Chong | ................. | H03K 5/2481 |
| | | | | 327/52 |
| 2017/0085266 A1* | 3/2017 | Zargham | ........ | H03K 19/018528 |
| 2018/0097488 A1* | 4/2018 | Giuffredi | ............ | H03F 3/45632 |

* cited by examiner

WIDE RANGE INPUT VOLTAGE DIFFERENTIAL RECEIVER

BACKGROUND

Technical Field

The embodiments described herein generally relate to data transfers in computing systems, and more particularly, to amplification of differentially encoded signals.

Description of the Relevant Art

Computing systems typically include a number of interconnected integrated circuits. Such integrated circuits may be designed to perform a particular function, such as, e.g., power supply voltage regulation, while other integrated circuits may include multiple circuit blocks, such as processor and memory circuits, for example. Integrated circuits with large number of circuit blocks designed for different functions may be referred to as "systems-on-a-chip" or "SoCs."

During operation, integrated circuits or circuit blocks may transmit requests to other integrated circuits or circuit blocks. Such requests may include a request for data, or to perform a particular operation or function. In response, an integrated circuit or circuit block may transmit a response in acknowledgement of completing a requested function or operation, or transmit requested data. A request with an associated response may be commonly referred to as a "transaction."

In order to transmit data bits included in a request or response, an integrated circuit or circuit block may change a voltage level of a wire coupled between the integrated circuit or circuit block, and a destination integrated circuit or circuit block to a particular voltage level. In various cases, the particular voltage level may correspond to particular data bit value. For example, a voltage level at or near a voltage level of a power supply signal may correspond to a logic one value.

To reduce power dissipation, some integrated circuits or circuit blocks may transmit a data bit using two wires. In such cases, a difference in the voltage levels between the two wires may correspond to a value for a given data. Data transmitted in such a fashion is commonly referred to as being "differentially encoded."

SUMMARY OF THE EMBODIMENTS

Various embodiments of a differential receiver circuit are disclosed. Broadly speaking, an apparatus and a method are contemplated, in which a first amplifier circuit may be configured to generate a first intermediate signal based on a first difference between a voltage level of a first input signal and a voltage level of a second input signal. A second amplifier circuit may be configured to generate a second intermediate signal based on a second difference between the voltage level of the second input signal and the voltage level of the first input signal. A regenerative amplifier circuit may be configured to increase a difference in a voltage level of the first intermediate signal and a voltage level of the second intermediate signal using regenerative feedback and based on the voltage level of the first input signal and the voltage level of the second input signal. A latch circuit may be configured to generate a first output signal and a second output signal using the first intermediate signal and the second intermediate signal.

In one embodiment, a duty cycle correction circuit may be configured to generate a corrected output signal using at least one of the first output signal and the second output signal. A duty cycle of the corrected output signal is different from a duty cycle of the at least one of the first output signal and the second output signal.

In another non-limiting embodiment, an amount of variation in the duty cycle of the corrected output signal from the duty cycle of the at least one of the first output signal and the second output signal is based upon a control signal. The control signal may include a plurality of data bits.

These and other embodiments will become apparent upon reference to the following description and accompanying drawings.

Figure 1:
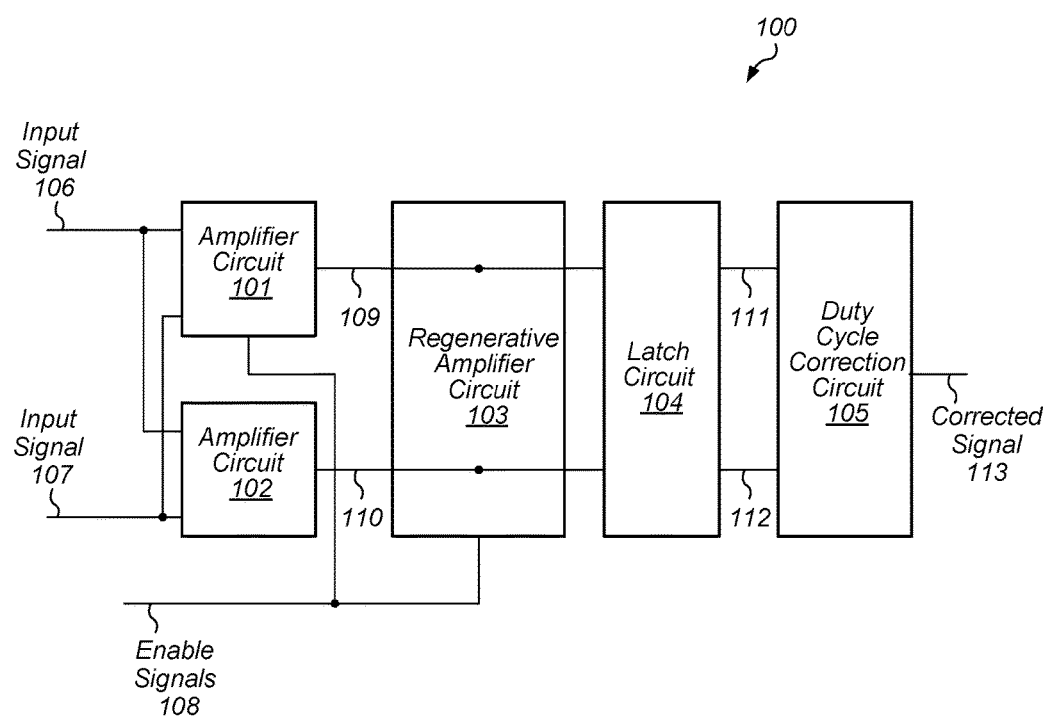
FIG. 1 illustrates a block diagram of a differential receiver.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

Power dissipated when transmitting data between integrated circuits, or between circuit blocks within an integrated circuit can result in excess heat generation and reduced battery lifetime for portable and wearable computing systems. To reduce power dissipation, the voltage swing, i.e., the difference in voltage levels corresponding to different logic signal levels, of transmitted signals may be reduced. In some cases, data bits may be differentially encoded allowing further reduction in the voltage swing, thereby further reducing power dissipation.

A receiving integrated circuit or circuit block may employ an amplifier to receive signals, or differentially encoded signals, with a reduced voltage swing in order to generate signals of sufficient voltage swing to be consumed by conventional logic gate circuits. Such amplifiers may be slow to operate, limiting bandwidth of transmitted data, as well as dissipating additional power due to bias circuits used to set the operating point of the amplifiers. The embodiments illustrated in the drawings and described below may provide techniques for receiving reduced voltage swing signals while maintaining performance and minimizing power dissipation.

An embodiment of differential receiver circuit is illustrated in the block diagram of FIG. 1. In the illustrated embodiment, differential receiver circuit 100 includes amplifier circuit 101, amplifier circuit 102, regenerative amplifier circuit 103, latch circuit 104, and duty cycle correction circuit 105.

Amplifier circuit 101 may be configured to generate intermediate signal 109 based on a difference in a voltage level of input signal 106 and a voltage level of input signal 107. As described below in more detail, virtual power supply nodes included in amplifier circuit 101 may be selectively decoupled from power supply signals (not shown) using enable signals 108 to reduce power dissipation when amplifier circuit 101 is not in use. As used and described herein, an enable signal may be a particular example of a control signal that may be used to activate or deactivate a circuit or circuit block.

Amplifier circuit 102 may be configured to generate intermediate signal 110 based on a difference in the voltage level of input signal 107 and the voltage level of input signal 106. In various embodiments, amplifier circuit 102 may employ a circuit similar to amplifier circuit 101 with input signals 106 and 107 coupled to different input terminals of the amplifier circuit. It is noted that by coupling input signals 106 and 107 to different input terminals of amplifier circuits 101 and 102, the polarity of intermediate signals 109 and 110 may be opposite to each other relative to a common mode operating point of amplifier circuits 101 and 102.

Regenerative amplifier circuit 103 may be configured to increase a difference between the voltage levels of intermediate signal 109 and intermediate signal 110 using regenerative feedback, as well as the voltage levels of input signals 106 and 107. As used and described herein regenerative feedback refers to a technique where a phase inverted portion of a first signal is coupled to a second signal, and a phase inverted portion of the second signal is coupled to the first signal. By employing regenerative feedback, regenerative amplifier circuit 103 may, in various embodiments, increase the difference in the voltage levels between intermediate signals 109 and 110 with minimal delay and power dissipation.

As described below in more detail, latch circuit 104 may generate output signals 111 and 112 using intermediate signals 109 and 110. In various embodiments, latch circuit 104 may include cross-coupled inverters to capture and maintain a logical state of output signals 111 and 112.

In some situations, a duty cycle associated with input signals 106 and 107 may be distorted due to noise, jitter, or other undesirable effects within a computing system. Duty cycle correction circuit 105 may be configured to allow correction of the duty cycle of at least one of output signals 111 and 112 to generate corrected signal 113. In various embodiments, control signals may be used to selectively adjust the duty cycle of the aforementioned signals by activating or deactivating pull-up or pull-down devices included in gated inverter circuits that are coupled in parallel.

It is noted that the embodiment depicted in FIG. 1 is merely an example. In other embodiments, different circuit blocks and different arrangements of circuit blocks may be employed.

Figure 2:
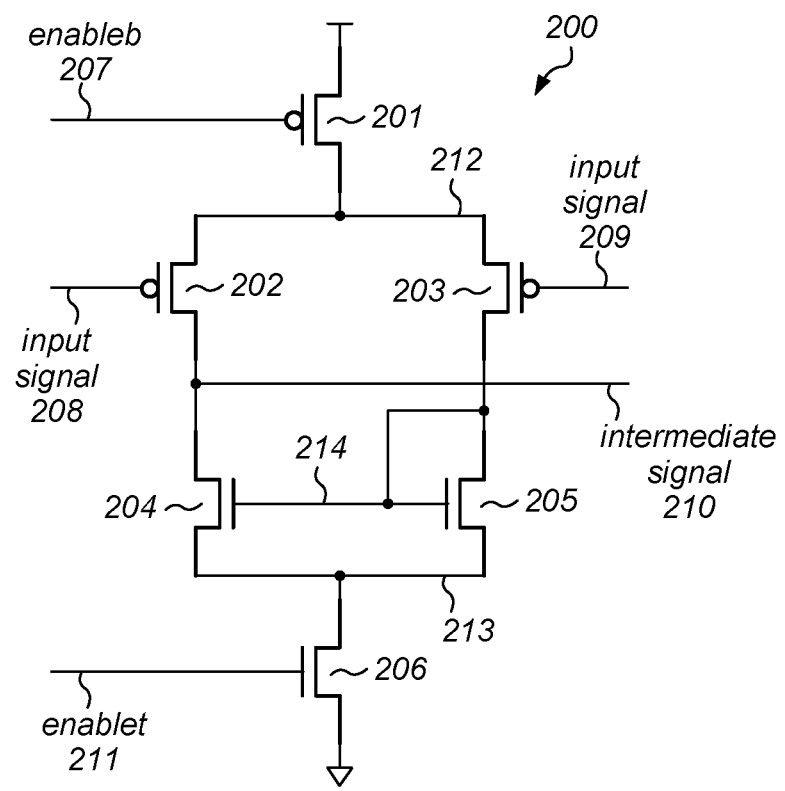
FIG. 2 illustrates a block diagram of an amplifier circuit.

In order to amplify the difference between the voltage levels of the input signals, a differential amplifier may be employed. An embodiment of a differential amplifier is illustrated in FIG. 2. In various embodiments, differential amplifier circuit 200 may correspond to either of amplifier circuit 101 or amplifier circuit 102 as depicted in the embodiment of FIG. 1. In the illustrated embodiment, differential amplifier circuit 200 includes devices 201, 202, 203, 204, 205, and 206.

Device 201 is coupled between a power supply signal and virtual power supply node 212, and is controlled by enableb 207. In some embodiments, enableb 207 may be included in enable signals 108 as depicted in FIG. 1. Devices, such as device 201 that are used to selectively provide power to a virtual supply node are commonly referred to as "header devices." As used and described herein, a header device refers to a device that is coupled between a virtual power supply circuit node and a power supply signal.

Device 206 is coupled between a ground supply signal and virtual ground node 213, and is controlled by enablet 211. In some embodiments, enablet 211 may be included in enable signals 108 as illustrated in FIG. 1. Devices, such as device 206, that are used to selectively discharge a virtual ground circuit node are commonly referred to as "footer devices." As used herein, a footer device refers to a device coupled between a ground supply signal and a virtual ground circuit node.

As used and described herein a device refers to transconductance device where the current flowing through the device is based upon a voltage across the device. For example, in various embodiments, a device may be a p-channel or n-channel metal-oxide semiconductor field-effect transistor, a PNP or NPN bipolar transistor, or any other suitable transconductance device.

Device 202 is coupled between virtual power supply node 212 and intermediate signal 210, and is controlled by input signal 208. In some embodiments, intermediate signal 210 may correspond to either of intermediate signals 109 or 110, and input signal 208 may correspond to either of input signals 106 or 107 as depicted in FIG. 1.

Device 203 is coupled between node 214 and virtual ground node 213, and is controlled by input signal 209. In various embodiments, input signal 209 may correspond to either of input signals 106 or 107 as illustrated in FIG. 1.

Device 204 is coupled between intermediate signal 210 and virtual ground node 213, and controls intermediate signal 210. Device 205 is coupled between node 214 and virtual ground node 213, and is controlled by node 214.

During operation when enablet 211 is at a low logic level and enableb 207 is at a high logic level, devices 201 and 206 are in a non-conductive state, de-coupling virtual power supply node 212 from the power supply signal, and de-coupling virtual ground node 213 from the ground supply signal. With no power and ground connections, differential amplifier does not operate and, in some embodiments, dissipates little power.

As used and described herein, a logical-0, logic 0 value or low logic level, describes a voltage sufficient to activate a p-channel metal-oxide semiconductor field effect transistor (MOSFET), and that a logical-1, logic 1 value, or high logic level describes a voltage level sufficient to activate an n-channel MOSFET. It is noted that, in various other embodiments, any suitable voltage levels for logical-0 and logical-1 may be employed.

When enablet 211 is transitioned to a high logic level, and enableb 207 is transitioned to a low logic level, devices 201 and 206 are in a conductive state, coupling virtual power supply node 212 to the power supply signal, and coupling virtual ground node 213 to the ground supply signal. It is noted that differential amplifier circuit 200 is self-biasing, and that once devices 201 and 206 are in the conductive state, and no additional bias circuit external to differential amplifier circuit 200 are needed.

Once power and ground connections are available to differential amplifier circuit 200, it may begin to amplify the difference between the voltage levels of input signal 208 and input signal 209. The voltage level of input signal 208 allows a current to flow through devices 202 and 204, and the voltage level of input signal 209 allows a current to flow through devices 203 and 205. As a result of the current mirror formed by devices 204 and 205, resulting in a difference in the voltage levels of on the source terminals of devices 202 and 203. Accordingly, the voltage level of intermediate signal 210 corresponds to a difference in the voltage levels of input signals 208 and 209. It is noted that by switching the connections of input signals 208 and 209, the polarity of the voltage level of intermediate signal 210 relative to a common mode operating point of differential amplifier circuit 200 may be reversed.

It is noted that the embodiment depicted in FIG. 2 is merely an example. In other embodiments, different devices and different number of devices are possible and contemplated.

Figure 3:
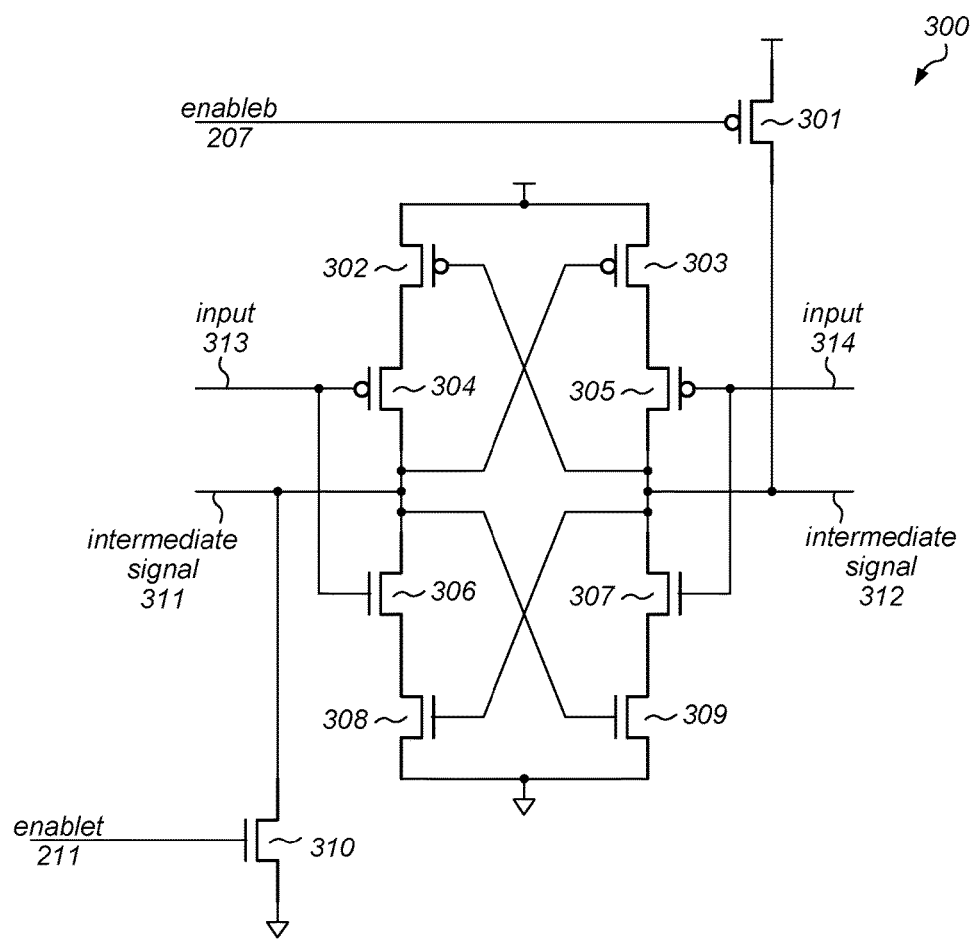
FIG. 3 illustrates a block diagram of regenerative amplifier circuit.

Turning to FIG. 3, an embodiment of a regenerative amplifier circuit is illustrated. In various embodiments, regenerative amplifier circuit 300 may correspond to regenerative amplifier circuit 103 as depicted in the embodiment of FIG. 1. In the illustrated embodiment, regenerative amplifier circuit 300 includes devices 301 through 310.

Device 301 is coupled between intermediate signal 312 and a power supply signal and is controlled by enableb 207, while device 310 is coupled between intermediate signal 311 and a ground supply signal and is controlled by enablet 211. In various embodiments, intermediate signal 312 may correspond to intermediate signal 109, and intermediate signal 311 may correspond to intermediate signal 110. Enableb 207 and enablet 211 may, in some embodiments, be included in enable signals 108.

Device 302 is coupled to device 304 and the power supply signal, and is controlled by intermediate signal 312. Device 303 is coupled to device 305 and the power supply signal, and is controlled by intermediate signal 311. Device 304 is additionally coupled to intermediate signal 311, and is controlled by input 313, while device 305 is additionally coupled to intermediate signal 312 and is controlled by input 314. In various embodiments, input 313 and input 314 may correspond to input signals 106 and 107, respectively.

Device 308 is coupled to the ground supply signal and device 306, and is controlled by intermediate signal 312. Device 309 is also coupled to the ground signal and device 307, and is controlled by intermediate signal 311. Device 306 is additionally coupled to intermediate signal 311 and is controlled by input 313, while device 307 is additionally coupled to intermediate signal 312 and is controlled by input 314.

When enableb 207 is in at a low logic level, device 301 is in a conductive state, allowing current to flow from the power supply signal to intermediate signal 312, allowing intermediate signal 312 to charge to a voltage level at or near a voltage level of the power supply signal.

In a similar fashion, when enablet 211 is at a high logic level, device 310 is in a conductive state, allowing current to flow from intermediate signal 311 into the ground supply signal. This results a voltage level of intermediate signal 311 at or near ground potential.

When enableb 207 is at a high logic level and enablet 211 is at a low logic level, devices 301 and 310 are disabled, allowing the voltage levels of intermediate signals 311 and 312 to be determined by devices 302 through 309.

When the voltage level of input 313 is greater than the voltage level of input 314, the voltage level intermediate signal 311 is less than the voltage level of intermediate signal 312 (as determined by amplifier circuits, such as, e.g., amplifier circuit 101 and 102 of FIG. 1). Devices 306 and 305 are, therefore, in a more conductive mode, than devices 304 and 307. Moreover, devices 308 and 303 are in a more conductive mode than devices 302 and 309. As a result of the regenerative feedback of devices 302, 303, 308 and 309, more current is sunk from than sourced to intermediate signal intermediate signal 311, and more current is sourced to that sunk from intermediate signal 312, thereby increasing the voltage difference between intermediate signal 311 and intermediate signal 312.

In a similar fashion, when the voltage level of input 313 is less than the voltage level of input 314, the voltage level of intermediate signal 311 is greater than the voltage level of intermediate signal 312. Devices 304 and 307 are in a more conductive state than devices 306 and 306, and devices 302 and 309 are in a more conductive state than devices 303 and 308. Again, as a result of the regenerative feedback of devices 302, 303, 308 and 309, more current is sourced to than sunk from intermediate signal 311, and more current is sunk from than source to intermediate signal 312, thereby increasing the voltage difference between intermediate signal 311 and intermediate signal 312.

It is noted that the embodiment depicted in the schematic diagram of FIG. 3 is merely an example. In other embodiments, different numbers and arrangements of devices are possible and contemplated.

Figure 4:
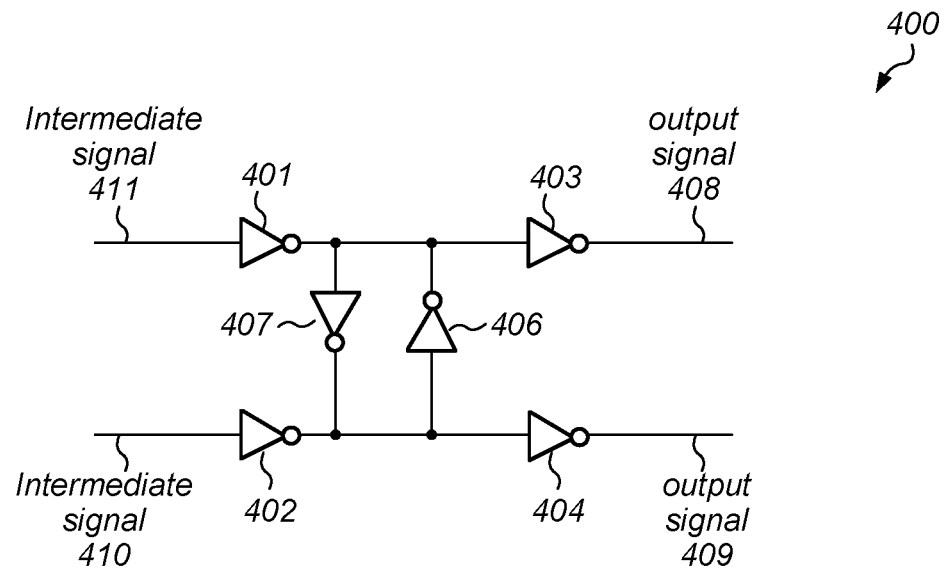
FIG. 4 illustrates a block diagram of a latch circuit.

As described above, to capture amplified data, a latch circuit is employed. A particular embodiment of a latch circuit is illustrated in FIG. 4. In various embodiments, latch circuit 400 may correspond to latch circuit 104 as illustrated in FIG. 1. In the illustrated embodiment, latch circuit 400 includes inverters 401, 402, 403, and 404.

An input of inverter 401 is coupled to intermediate signal 411, and an output of inverter 401 is coupled to an input of inverter 407, an output of inverter 406, and an input of inverter 403. An output of inverter 403 is coupled to output signal 408.

An input of inverter 402 is coupled to intermediate signal 410, and an output of inverter 402 is coupled to an output of inverter 407, an input of inverter 406, and an input of inverter 404. An output of inverter 404 is coupled to output signal 408. In various embodiments, intermediate signals 411 and 410 may correspond to intermediate signals 109 and 110 as depicted in FIG. 1. Additionally, output signals 408 and 409 may, in some embodiments, correspond to output signals 111 and 112 as illustrated in FIG. 1.

During operation, inverter 401 generates a signal on its output whose logical sense is inverted from intermediate signal 411. In a similar fashion, inverter 402 generates a signal on its output whose logical sense is inverted from intermediate signal 410. It is noted that the logical value of intermediate signal 411 is opposite of the logical sense of intermediate signal 410.

Inverters 407 and 406 are coupled in a cross-coupled fashion, reinforcing the signals values generated by inverters 401 and 402 using regenerative feedback to maintain the opposite logical states of the outputs of inverters 401 and 402. Inverter 403 inverts the logical sense of the output of inverter 401 to generate output signal 408, and inverter 404 inverts the logical sense of the output of inverter 402 to generate output signal 409.

It is noted that an inverter, such as those shown and described herein, may be a particular embodiment of an CMOS inverting amplifier. In other embodiments, however, any suitable configuration of inverting amplifier that is capable of inverting the logical sense of a signal may be used, including inverting amplifiers built using technology other than CMOS.

It is noted that the embodiment depicted in FIG. 4 is merely an example. In other embodiments, different numbers of inverters and different arrangements of inverters may be employed.

Figure 5:
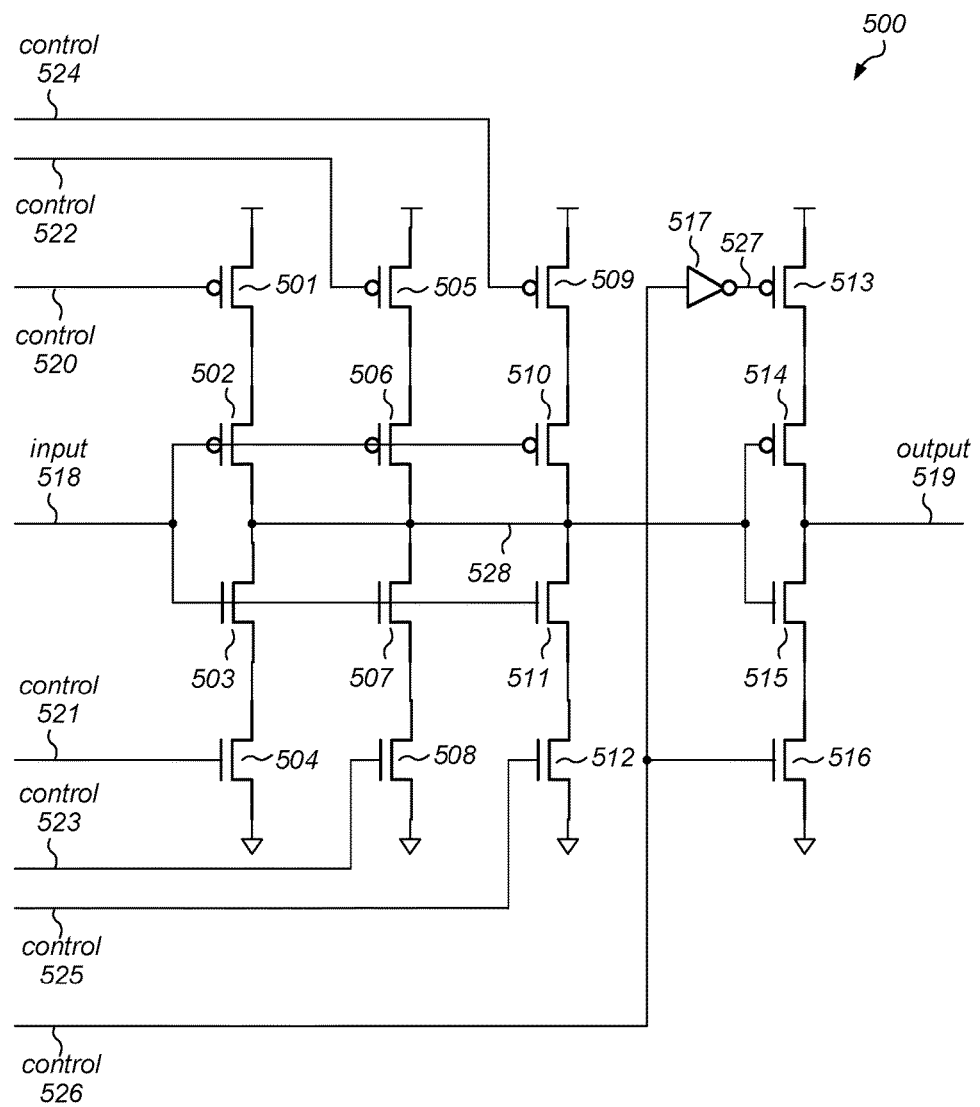
FIG. 5 illustrates a block diagram of duty cycle correction circuit.

Turning to FIG. 5, an embodiment of a duty cycle correction circuit is depicted. In various embodiments, duty cycle correction circuit 500 may correspond to duty cycle correction circuit 105 as illustrated in FIG. 1. In the illustrated embodiment, duty cycle correction circuit 500 includes devices 501 through 516 and inverter 517.

Devices 501, 505, 509 and 513 are also coupled to a power supply signal. Device 501 is controlled by control 520 and is coupled to device 502. Device 505 is coupled to device 506, and is controlled by control 522, while device 509 is coupled to device 510 and is controlled by control 524. Device 513 is coupled to device 514 and is controlled by node 527.

Devices 504, 508, 512, and 516 are coupled to the ground supply signal. Device 504 is controlled by control 521 and is coupled to device 503. Device 508 is coupled to device 507, and is controlled by control 523, while device 512 is coupled to device 511 and is controlled by control 525. Device 516 is coupled to device 515 and is controlled by control 526.

Devices 502, 503, 506, 507, 510 and 511 are controlled by input 518 and coupled to node 528. Devices 514 and 515 are controlled by node 528 and coupled to output signal 519. An input of inverter 517 is coupled to control 526, and an output of inverter 517 is coupled to node 527.

In various embodiments, input 518 may correspond to either of output signals 111 and 112. Output signal 519 may, in some embodiments, correspond to corrected signal 113.

During operation, a voltage level of input 518 selectively changes the conduction mode of devices 502, 503, 506, 507, 510 and 511. The ability of the aforementioned devices to sink current to or source current from node 528 is based on the conduction states of devices 501, 504, 505, 508, 509, and 512, which is controlled by the voltage levels of control 520 through control 526. By adjusting the voltage levels of control 520 through control 526, the amount of current sourced to or sunk from node 528 based on the logical value of input 518. By individually adjusting the each of the aforementioned control signals, the rise or fall time of node 528 can be modified, thereby adjusting the duty cycle of node 528 relative to input 518. By adjusting the duty cycle in this fashion, the effect of variations in the duty cycle of received input signals, such as, e.g., input signals 106 and 107 can be reduced.

The conduction of devices 514 and 515 is controlled by the voltage level of node 528. Inverter 517 inverts the logical sense of control 526 to generate a signal on node 527. When control 526 is at a high logic level, node 527 is at a low logic level, enabling both devices 513 and 516, allowing device 514 and 515 to function as an inverter to invert the logical sense of node 528 to create output signal 519. Alternatively, if control 526 is at a low logic level, node 527 will be at a high logic level, disabling both devices 513 and 516, resulting in a high impedance on output signal 519. It is noted that in various embodiments, control 520 through control 526 may be under software control and may be adjusted during operation of a computing system. In some embodiments, control 520 through control 526 may each correspond to respective data bits of a plurality of data bits included in a control signal.

It is noted that the embodiment depicted in the FIG. 5 is merely an example. In other embodiments, different numbers of devices, and different arrangements of devices are possible and contemplated.

Figure 6:
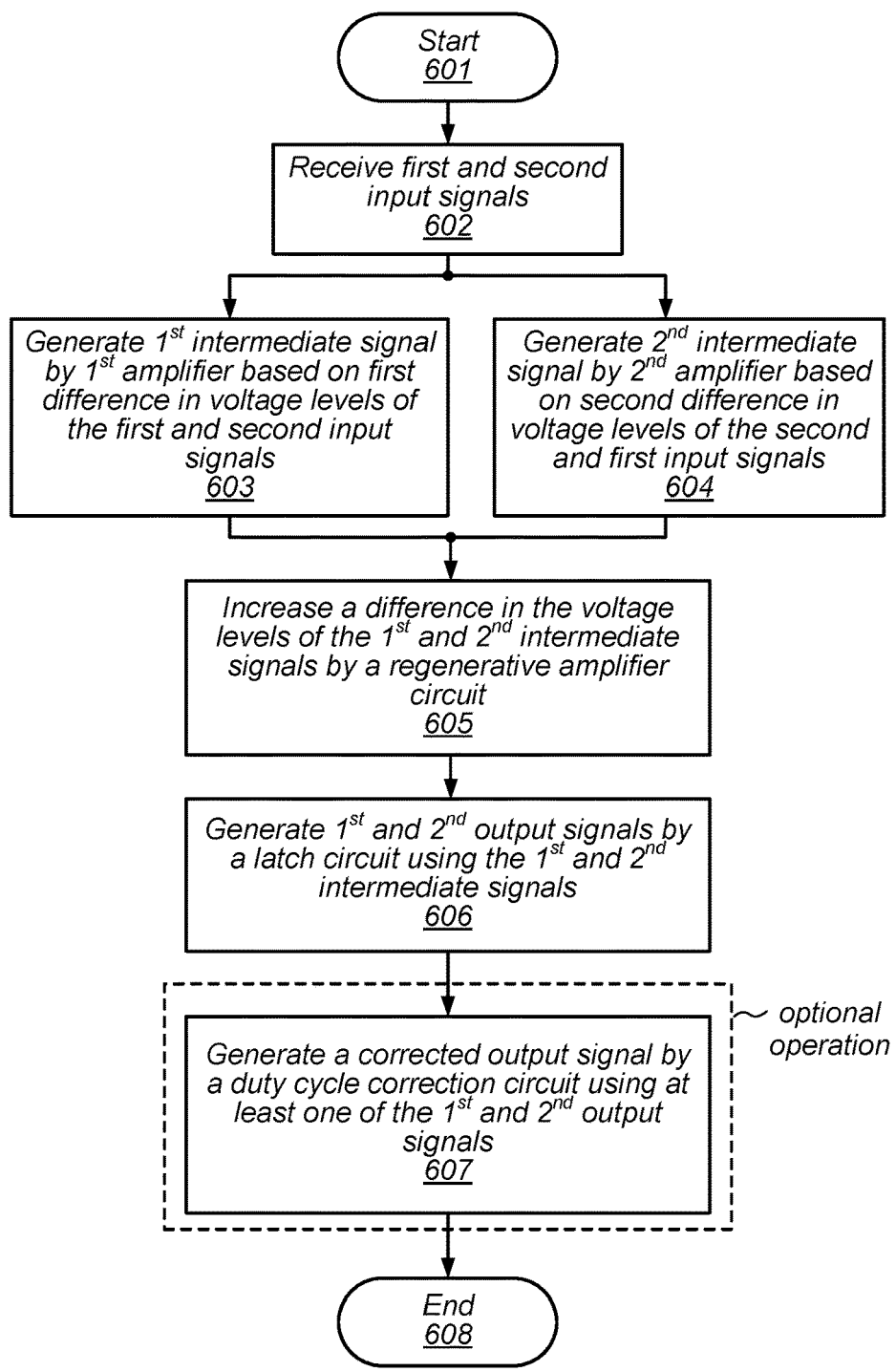
FIG. 6 illustrates flow diagram depicting an embodiment of a method for operating a differential receiver.

An embodiment of a method for operation a differential receiver, such as, e.g., differential receiver circuit 100, is illustrated in FIG. 6. The method begins in block 601.

The differential receiver circuit may then receive first and second input signals (block 602). In various embodiments, the first and second input signals may differentially encode data bits transmitted from another integrated circuit or circuit blocks.

A first amplifier circuit may then generate a first intermediate signal based on a first difference between a voltage level of the first input signal and the second input signal (block 603). In parallel with the first amplifier circuit, a second amplifier circuit may then generate a second intermediate signal based on a second difference between the voltage level of the second input signal and the voltage level of the first input signal (block 604).

A regenerative amplifier circuit, such as, e.g., regenerative amplifier circuit 300, may then increase a difference in the voltage level of first intermediate signal and the voltage level of the second intermediate signal (block 605). In various embodiments, the regenerative amplifier circuit may increase the difference in the voltage levels based on the voltage levels of the first and second input signals, and may employ regenerative feedback.

A latch circuit may then generate a first output signal and a second output signal using the first intermediate signal and the second intermediate signal (block 606). The latch circuit may, in various embodiments, employ cross-coupled inverters to maintain the logical state of the first and second output signals.

As an optional operation, a duty cycle correction circuit may generate a corrected output signal using at least one of the first output signal and the second output signal (block 607). In various embodiments, a duty cycle of the corrected output signal is different from a duty cycle of the at least one of the first output signal and the second output signal. An amount of variation in the duty cycle of the corrected output signal may be based on a control signal, which includes a plurality of data bits. The method may then conclude in block 608.

It is noted that the embodiment of the method depicted in the flow diagram of FIG. 6 is merely an example. In other embodiments, different operations and different orders of operations may be employed.

Figure 7:
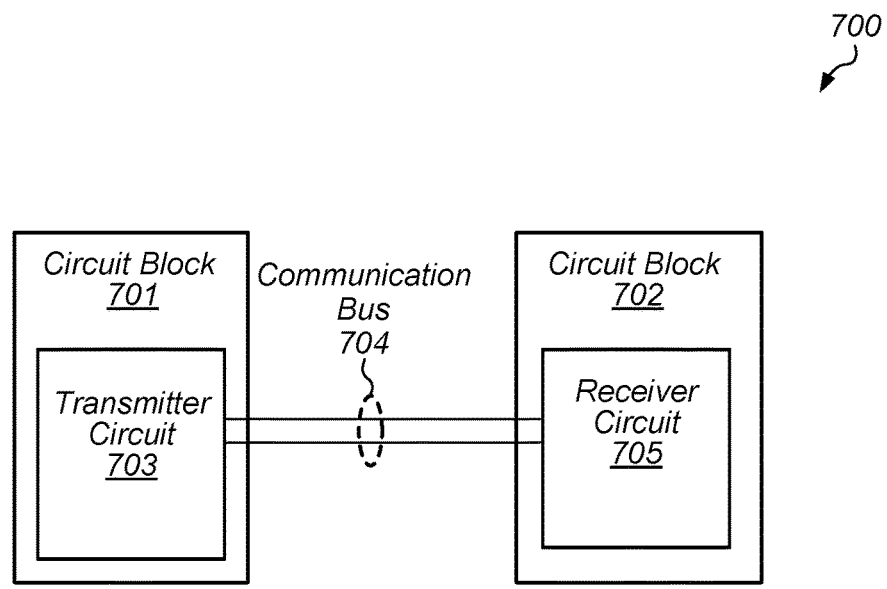
FIG. 7 illustrates a block diagram of two devices included in a computing system.

In addition to exploiting sparse data during memory accesses, communication of data between devices in a computing system may also take advantage of the detection of sparse data. An embodiment of a computing system is illustrated in FIG. 7. In the illustrated embodiment, computing system 700 includes circuit blocks 701 and 702, coupled by communication bus 704.

Circuit block 701 includes transmitter circuit 703 In various embodiments, circuit block 701 may be a processor, processor core, memory, input/output circuit, analog/mixed signal circuit, or any other suitable circuit block that may be included in an integrated circuit. It is noted that although circuit block 701 is depicted as only including transmitter circuit 703, in other embodiments, multiple other circuit sub-blocks may be included in circuit block 701.

Transmitter circuit 703 may be configured to transmit signals via communication bus 704. Such signals may differentially encode one or more data bits, where a difference in between voltage levels of the signals included in communication bus 704 correspond to a particular logic level. In some cases, the generation of signals may include encoding the data bits, converting voltage levels associated with the data bits or any other suitable processing. It is noted that although two signal lines are included in communication bus 704, in other embodiments, any suitable number of signal lines may be employed.

Circuit block 702 includes receiver circuit 705. Like circuit block 701, circuit block 702 may be a processor, processor core, memory, or any other suitable circuit block configured to receive data from transmitter circuit 703. Receiver circuit 705 may, in various embodiments, correspond to differential receiver circuit 100 as illustrated in FIG. 1. and may be configured to receive signals transmitted on communication bus 704 and convert the received signals to data bits. In some embodiments, receiver circuit 705 may also be configured to modify the duty cycle of output signals of the detected data bits based on one or more control signals.

It is noted that circuit blocks 701 and 702 may be fabricated on a single silicon substrate, or may be separately fabricated integrated circuits coupled together on a circuit board or other suitable substrate. Although only two circuit blocks are depicted in the embodiment of FIG. 7, in other embodiments, any suitable number of devices may be employed.

In many computing systems, data capture circuits are included in the data pathways to and from a memory circuit to allow for pipelined operation through logic circuits included in the computing system. Such data capture circuits may include latch circuit, flip-flop circuits, or any other suitable circuit configured to sample and store data based on a timing signal, such as, a clock signal for example.

Figure 8:
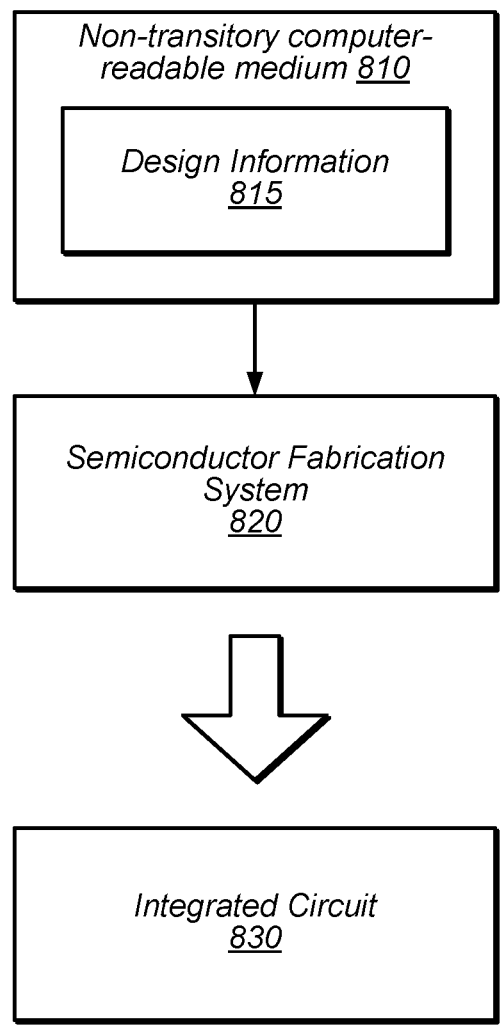
FIG. 8 illustrates a block diagram illustrating an embodiment of a computer-readable storage medium.

FIG. 8 is a block diagram illustrating an example non-transitory computer-readable storage medium that stores circuit design information, according to some embodiments. In the illustrated embodiment, semiconductor fabrication system 820 is configured to process the design information 815 stored on non-transitory computer-readable storage medium 810 and fabricate integrated circuit 830 based on the design information 815.

Non-transitory computer-readable storage medium 810, may comprise any of various appropriate types of memory devices or storage devices. Non-transitory computer-readable storage medium 810 may be an installation medium, e.g., a CD-ROM, floppy disks, or tape device; a computer system memory or random access memory such as DRAM, DDR RAM, SRAM, EDO RAM, LPDDRxx, HBMxx, wideIOxx, Rambus RAM, etc.; a non-volatile memory such as a Flash, magnetic media, e.g., a hard drive, or optical storage; registers, or other similar types of memory elements, etc. Non-transitory computer-readable storage medium 810 may include other types of non-transitory memory as well or combinations thereof. Non-transitory computer-readable storage medium 810 may include two or more memory mediums which may reside in different locations, e.g., in different computer systems that are connected over a network.

Design information 815 may be specified using any of various appropriate computer languages, including hardware description languages such as, without limitation: VHDL, Verilog, SystemC, SystemVerilog, RHDL, M, MyHDL, etc. Design information 815 may be usable by semiconductor fabrication system 820 to fabricate at least a portion of integrated circuit 830. The format of design information 815 may be recognized by at least one semiconductor fabrication system, such as semiconductor fabrication system 820, for example. In some embodiments, design information 815 may include a netlist that specifies elements of a cell library, as well as their connectivity. One or more cell libraries used during logic synthesis of circuits included in integrated circuit 830 may also be included in design information 815. Such cell libraries may include information indicative of device or transistor level netlists, mask design data, characterization data, and the like, of cells included in the cell library.

Integrated circuit 830 may, in various embodiments, include one or more custom macrocells, such as memories, analog or mixed-signal circuits, and the like. In such cases, design information 815 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 820 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 820 may also be configured to perform various testing of fabricated circuits for correct operation.

In various embodiments, integrated circuit 830 is configured to operate according to a circuit design specified by design information 815, which may include performing any of the functionality described herein. For example, integrated circuit 830 may include any of various elements shown or described herein. Further, integrated circuit 830 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a first amplifier circuit configured to generate a first intermediate signal based on a first difference between a voltage level of a first input signal and a voltage level of a second input signal;
    a second amplifier circuit configured to generate a second intermediate signal based on a second difference between the voltage level of the second input signal and the voltage level of the first input signal;
    a third amplifier circuit configured to increase a difference in a voltage level of the first intermediate signal and a voltage level of the second intermediate signal using feedback and based on the voltage level of the first input signal and the voltage level of the second input signal; and
    a latch circuit configured to generate a first output signal and a second output signal using the first intermediate signal and the second intermediate signal.

2. The apparatus of claim 1, further comprising a duty cycle correction circuit configured to generate a corrected output signal using at least one of the first output signal and the second output signal, wherein a duty cycle of the corrected output signal is different from a duty cycle of the at least one of the first output signal and the second output signal.

3. The apparatus of claim 2, wherein an amount of variation in the duty cycle of the corrected output signal from the duty cycle of the at least one of the first output signal and the second output signal is based upon a control signal, wherein the control signal includes a plurality of data bits.

4. The apparatus of claim 2, wherein the duty cycle correction circuit is further configured to provide a high impedance output based on a control signal.

5. The apparatus of claim 1, wherein the third amplifier circuit is further configured to:
    set the voltage level of the first intermediate signal to a first voltage based on an enable signal; and
    set the voltage level of the second intermediate signal to a second voltage level, based on the enable signal.

6. The apparatus of claim 1, wherein the first amplifier circuit includes a header device and a footer device, and wherein the first amplifier circuit is further configured to disable the header device and the footer device based on a control signal.

7. A method, comprising:
    receiving a first input signal and a second input signal by a differential receiver circuit;
    generating, by a first amplifier circuit, a first intermediate signal based on a first difference between a voltage level of a first input signal and a voltage level of a second input signal;
    generating, by a second amplifier circuit, a second intermediate signal based on a second difference between the voltage level of the second input signal and the voltage level of the first input signal;
    increasing, by a third amplifier circuit, a difference in a voltage level of the first intermediate signal and a voltage level of the second intermediate signal using feedback and based on the voltage level of the first input signal and the voltage level of the second input signal; and
    generating, by a latch circuit, a first output signal and a second output signal using the first intermediate signal and the second intermediate signal.

8. The method of claim 7, further comprising generating, by a duty cycle correction circuit, a corrected output signal using at least one of the first output signal and the second output signal, wherein a duty cycle of the corrected output signal is different from a duty cycle of the at least one of the first output signal and the second output signal.

9. The method of claim 8, wherein an amount of variation in the duty cycle of the corrected output signal from the duty cycle of the at least one of the first output signal and the second output signal is based upon a control signal, wherein the control signal includes a plurality of data bits.

10. The method of claim 8, further comprising, providing, by the duty cycle correction circuit, a high impedance output based on a control signal.

11. The method of claim 7, further comprising:
    setting, by the third amplifier circuit, the voltage level of the first intermediate signal to a first voltage based on an enable signal; and
    setting, by the third amplifier circuit, the voltage level of the second intermediate signal to a second voltage level, based on the enable signal.

12. The method of claim 7, further comprising decoupling a local power signal included in the first amplifier circuit from a power supply signal based on an enable signal.

13. The method of claim 7, further comprising decoupling a local ground signal included in the first amplifier circuit from a ground signal based on an enable signal.

14. A non-transitory computer-readable storage medium having design information stored thereon, wherein the design information specifies a design of at least a portion of a hardware integrated circuit in a format recognized by a semiconductor fabrication system that is configured to use the design information to produce the hardware integrated circuit according to the design information, wherein the design information specifies that the hardware integrated circuit comprises:

a first amplifier circuit configured to amplify generate a first intermediate signal based on a first difference between a voltage level of a first input signal and a voltage level of a second input signal;

a second amplifier circuit configured to generate a second intermediate signal based on a second difference between the voltage level of the second input signal and the voltage level of the first input signal;

a third amplifier circuit configured to increase a difference in a voltage level of the first intermediate signal and a voltage level of the second intermediate signal using feedback and based on the voltage level of the first input signal and the voltage level of the second input signal; and a latch circuit configured to generate a first output signal and a second output signal using the first intermediate signal and the second intermediate signal.

15. The non-transitory computer-readable storage medium of claim 14, wherein the hardware integrated circuit further comprises a duty cycle correction circuit configured to generate a corrected output signal using at least one of the first output signal and the second output signal, wherein a duty cycle of the corrected output signal is different from a duty cycle of the at least one of the first output signal and the second output signal.

16. The non-transitory computer-readable storage medium of claim 15, wherein an amount of variation in the duty cycle of the corrected output signal from the duty cycle of the at least one of the first output signal and the second output signal is based upon a control signal, wherein the control signal includes a plurality of data bits.

17. The non-transitory computer-readable storage medium of claim 15, wherein the duty cycle correction circuit is further configured to provide a high impedance output based on a control signal.

18. The non-transitory computer-readable storage medium of claim 14, wherein the regenerative amplifier circuit is further configured to:

set the voltage level of the first intermediate signal to a first voltage based on an enable signal; and set the voltage level of the second intermediate signal to a second voltage level, based on the enable signal.

19. The non-transitory computer-readable storage medium of claim 14, wherein the first amplifier circuit includes a header device and a footer device, and wherein the first amplifier circuit is further configured to disable the header device and the footer device based on a control signal.

20. The non-transitory computer-readable storage medium of claim 14, wherein the regenerative amplifier circuit includes a first pull-up device controlled by the first intermediate signal, and a second pull-up device controller by the second intermediate signal.

* * * * *